US006454259B1

(12) United States Patent
Madsen et al.

(10) Patent No.: US 6,454,259 B1
(45) Date of Patent: Sep. 24, 2002

(54) SLIDING VALVE VACUUM HOLDDOWN METHOD AND APPARATUS

(75) Inventors: Jeffrey C. Madsen, Vancouver; Steven P. Downing, Camas, both of WA (US)

(73) Assignee: Hewlett-Packard Company, Palo Alto, CA (US)

( * ) Notice: Subject to any disclaimer, the term of this patent is extended or adjusted under 35 U.S.C. 154(b) by 18 days.

(21) Appl. No.: 10/012,268

(22) Filed: Nov. 6, 2001

Related U.S. Application Data

(63) Continuation of application No. 09/693,262, filed on Oct. 20, 2000, now Pat. No. 6,340,155, and a continuation of application No. 09/377,368, filed on Aug. 18, 1999, now Pat. No. 6,209,867.

(51) Int. Cl.[7] .................................................. G11C 7/00

(52) U.S. Cl. ...................... 271/276; 271/195; 271/196; 271/197; 271/183; 271/905; 271/377.04

(58) Field of Search ................................ 271/276, 195, 271/196, 197, 183; 209/905; 198/377.04

(56) References Cited

U.S. PATENT DOCUMENTS

| | | | | | |
|---|---|---|---|---|---|
| 4,173,301 | A | * | 11/1979 | Turini et al. | 226/102 X |
| 4,298,277 | A | * | 11/1981 | Silverberg | 355/76 X |
| 4,537,021 | A | * | 8/1985 | Parker | 57/401 X |
| 5,037,079 | A | | 8/1991 | Siegel et al. | 271/3 |
| 5,090,685 | A | * | 2/1992 | Danon et al. | 271/276 |
| 5,149,554 | A | * | 9/1992 | Alber | 426/420 X |
| 5,230,456 | A | * | 7/1993 | Germann et al. | 226/95 X |
| 5,276,465 | A | * | 1/1994 | Menard et al. | 346/134 X |
| 5,730,440 | A | * | 3/1998 | Motooka | 271/276 |
| 5,833,231 | A | * | 11/1998 | Schreiner | 271/197 |
| 5,865,433 | A | * | 2/1999 | Morrissette | 271/276 X |
| 6,089,156 | A | * | 7/2000 | Stephan | 101/230 X |
| 6,209,867 | B1 | * | 4/2001 | Madsen et al. | 271/183 |
| 6,340,155 | B1 | * | 1/2002 | Madsen et al. | 198/471.1 |
| 6,371,430 | B1 | * | 4/2002 | Vernackt | 248/362 |

* cited by examiner

*Primary Examiner*—Donald P. Walsh
*Assistant Examiner*—Kenneth W Bower

(57) ABSTRACT

A vacuum holddown has a holddown member with an outer surface for temporarily capturing a flexible sheet material via a vacuum force distributed across the outer surface through discrete vacuum channels. A vacuum force valving mechanism abuts an inner surface of the holddown member in a selectable sliding engagement. The valving mechanism has a pattern of apertures therethrough in predetermined pattern such that discrete valve mechanism positions produce discrete vacuum force patterns at the outer surface of the holddown member.

16 Claims, 5 Drawing Sheets

SLIDING VALVE VACUUM HOLDDOWN METHOD AND APPARATUS

CROSS REFERENCE TO RELATED APPLICATION(S)

This is a continuation of application Ser. No. 09/693,262 filed on Oct. 20, 2000 now U.S. Pat No. 6,340,155 which is hereby incorporated by reference herein.

This application is a continuation of U.S. patent application Ser. No. 09/377,368, filed on Aug. 18, 1999 now U.S. Pat. No. 6,209,867.

BACKGROUND OF THE INVENTION

1. Field of the Invention

The present invention relates generally to vacuum holddown apparatus and methods of operation and, more specifically, to a cut-sheet print media vacuum holddown particularly useful for a hard copy apparatus, such as an ink-jet printer.

2. Description of Related Art

It is known to use a vacuum induced force to adhere a sheet of flexible material to a surface, for example, for holding a sheet of print media temporarily to a platen. [Hereinafter, "vacuum induced force" is also referred to as "vacuum induced flow," "vacuum flow," or more simply as just "vacuum" or "suction".] Such vacuum holddown systems are a relatively common, economical technology to implement commercially and can improve machine throughput specifications. For example, it is known to provide a rotating drum with holes through the surface so that a vacuum through the drum cylinder provides a suction force at the holes in the drum surface. [The term "drum" as used hereinafter is intended to be synonymous with any curvilinear implementation incorporating the present invention; while the term "platen" can be defined as a flat holding surface, in hard copy technology it is also used for curvilinear surfaces, such as a common typewriter rubber roller; thus, for the purposes of the present application, "platen" is used generically for any shape holddown surface used in a flexible material holddown apparatus.]

Generally in a hard copy apparatus implementation, the platen is used either to transport cut-sheet print media to a printing station of a hard copy apparatus, such as a copier or a computer printer, or to hold the cut sheet print media at the printing station while images are formed (also known as the "print zone"), or both. [In order to simplify discussion, the term "paper" is used hereinafter to refer to all types of print media. No limitation on the scope of the invention is intended nor should any be implied.]

One universal problem, particularly pertinent in the adaptation of a vacuum holddown to use in a hard copy apparatus, is the management of different sizes, shapes, and thicknesses of available paper. Open holes around the edges of a sheet smaller than the dimensions of the vacuum field across the platen surface results in vacuum losses and a lower or ineffective holding force. In other words, too many exposed vacuum ports result in a loss of suction at the platen surface and the paper is not firmly adhered to the surface.

One technique for controlling a vacuum holddown is proposed by Rasmussen et al. in U.S. patent application Ser. No. 09/292,767 for a PRINT MEDIA VACUUM HOLDDOWN (assigned to the common assignee of the present invention and incorporated herein by reference). A vacuum holddown for sheet materials has a surface having a field of vacuum ports in which each individual port is gated. When a vacuum is applied to the underside of the holddown, the gates close. When a sheet of material is introduced onto a region of the field, the gates only within vacuum manifold passageway covered by the material are configured to spring open, applying a suction force to the sheet via the now opened ports. The holddown thus automatically adjusts to material size. An implementation for use in an ink-jet printer with cut-sheet print media is demonstrated.

Another technique is demonstrated by Rhodes et al. in U.S. patent application Ser. No. 09/292,125 for a VACUUM CONTROL FOR VACUUM HOLDDOWN (assigned to the common assignee of the present invention and incorporated herein by reference). A mechanism for manifolding a vacuum force to separate surface sectors of a vacuum holddown uses subsurface ducting to apply the vacuum to separate subsurface vacuum plenums wherein each is fluidically coupled to a separate surface sectors. The plenum is segregated by a diaphragm into surface side and vacuum side cavities. Trigger ports and appropriate ducting through the holddown subjacent the surface associated with each sector determine how the vacuum is routed. Only when a trigger port is covered is the vacuum routed to the surface sector associated therewith. The system can be implemented in planar or curvilinear constructs and be provided with features to accommodate a near-continuous range of flexible material sizes. A specific implementation in an ink-jet hard copy apparatus is also described.

Related to the Rasmussen et al. and Rhodes et al. Applications, U.S. patent application Ser. No. 09/292,838 for a VACUUM SURFACE FOR WET DYE HARD COPY APPARATUS by Wotton et al. (assigned to the common assignee of the present invention and incorporated herein by reference) shows a platen surface structure construct, particularly useful in a hard copy apparatus for a vacuum holddown, configured by dimensioning print media platen surface structure channels and ports in order to ensure print media leading edge and trailing edge holddown. The vacuum is distributed across the platen surface in accordance with predetermined dye flow characteristics based upon known dye composition and known print medium composition and such that print artifacts are not created by vacuum pulling wet dye through the capillaries of the medium.

There is a continuing need to direct vacuum forces to specific locations of a holddown to increase vacuum efficiency and improve holddown force. Moreover, there is a need for a vacuum holddown for sheet material transport that can adjust to hold a variety of sizes of materials.

SUMMARY OF THE INVENTION

In its basic aspects, the present invention provides a vacuum holddown apparatus, having a vacuum source, including: at least two sheets of material, said sheets separating a substrate held by vacuum from the vacuum source, wherein each of the sheets is provided with a plurality of vacuum ports and each sheet has a different pattern of the vacuum ports; and said sheets are mounted in sliding contact engagement such that shifting said engagement varies the pattern of vacuum application through the pair.

In another aspect, the present invention provides a method for distributing a vacuum holddown vacuum force to a substrate holding surface having a plurality of vacuum transmitting first apertures therethrough in a first predetermined pattern, the method including: adjacently to said surface, mounting a valve for redistributing the vacuum force between predetermined sets of channels wherein said valve has a complementary shape and size with respect to said surface, said valve means having vacuum transmitting second apertures therethrough arrayed in a second predetermined pattern; and selectively moving the valve to align selected ones of said second apertures to selected ones of said first apertures in accordance with producing a predetermined vacuum force distribution at said first surface.

In yet another aspect, the present invention provides a hard copy apparatus, having a vacuum source producing a predetermined vacuum force, the apparatus including: a platen having a holddown surface and a plurality of vacuum transmitting first apertures therethrough channels in a first predetermined array, each of the first apertures fluidically coupling the vacuum force to the surface; and mounted in sliding abutment and separating the platen from the vacuum source, at least one vacuum distribution altering device having vacuum transmitting second apertures therethrough in a second predetermined array such that discrete positions of the vacuum distribution altering device with respect to the platen produce discrete vacuum force patterns at the surface.

In another aspect, the present invention provides a vacuum drum printer vacuum drum device including: a drum having a plurality of vacuum channels in a first predetermined array across a drum outer surface, each of the vacuum channels having a vacuum port fluidically coupling an associated vacuum channel to a drum inner surface; and mounted within the drum, at least one sleeve having a sleeve outer surface in sliding face-to-face contact with the drum inner surface and having apertures therethrough in a second predetermined array such that discrete sleeve positions produce discrete vacuum patterns at the outer surface of the drum.

Some of the advantage of the present invention are:

it provides a means for directing vacuum forces to specific areas for maximum media hold down;

it provides improved vacuum efficiency by making an adjustment as a variable sized sheet is delivered to the holddown, focusing the highest vacuum forces at the leading edge and a region where the rest of the sheet progressively comes into contact with the holddown;

it supplies the highest relative vacuum forces on the leading and trailing edges of the sheet;

it is useful to adjust for different widths of sheets by sealing off the vacuum ports with are outside a chosen sheet width;

it provides a low cost manufacturing solution to the problem of distributing vacuum forces across a holddown where adjustment for held sheet widths is required; and in a vacuum drum hard copy apparatus implementation, a paper transport system implementation is operable while being moved at a relatively high speed of rotation.

The foregoing summary and list of advantages is not intended by the inventor to be an inclusive list of all the aspects, objects, advantages and features of the present invention nor should any limitation on the scope of the invention be implied therefrom. This Summary is provided in accordance with the mandate of 37 C.F.R. 1.73 and M.P.E.P. 608.01(d) merely to apprize the public, and more especially those interested in the particular art to which the invention relates, of the nature of the invention in order to be of assistance in aiding ready understanding of the patent in future searches. Other objects, features and advantages of the present invention will become apparent upon consideration of the following explanation and the accompanying drawings, in which like reference designations represent like features throughout the drawings.

The drawings referred to in this specification should be understood as not being drawn to scale except if specifically annotated.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable.

Figure 1B:
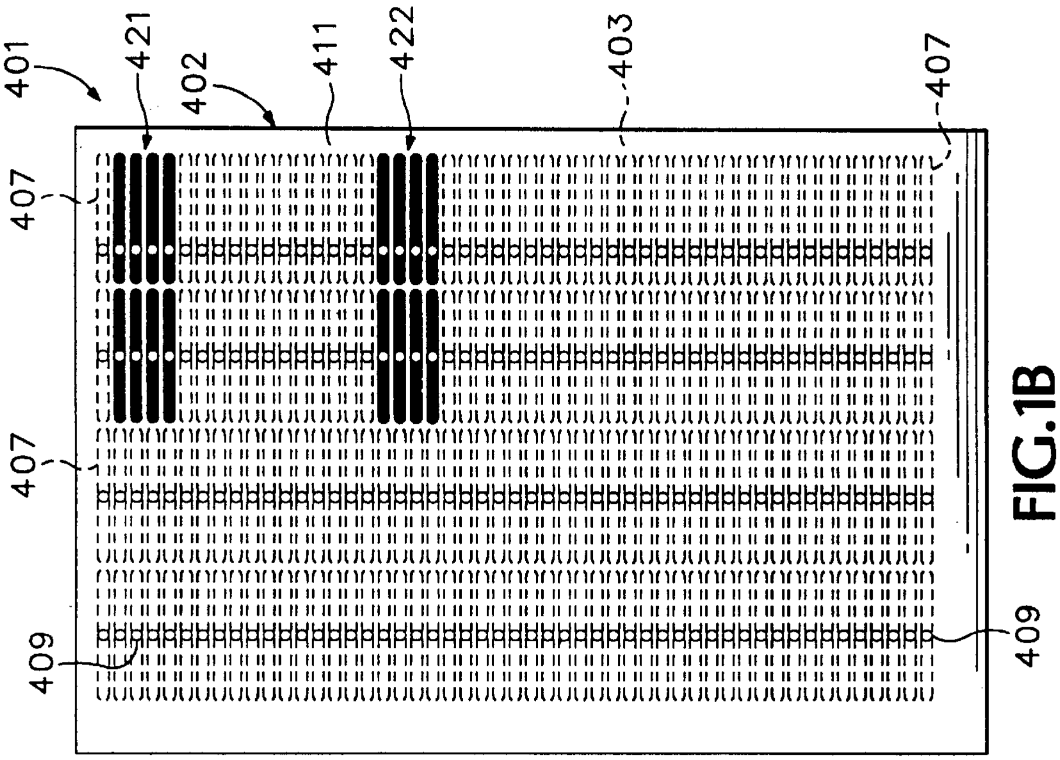
FIGS. 1A through 1D demonstrate a first embodiment of the present invention in a planar illustration, showing vacuum distribution for different positions of a vacuum valve sleeve.
Figure 1A:
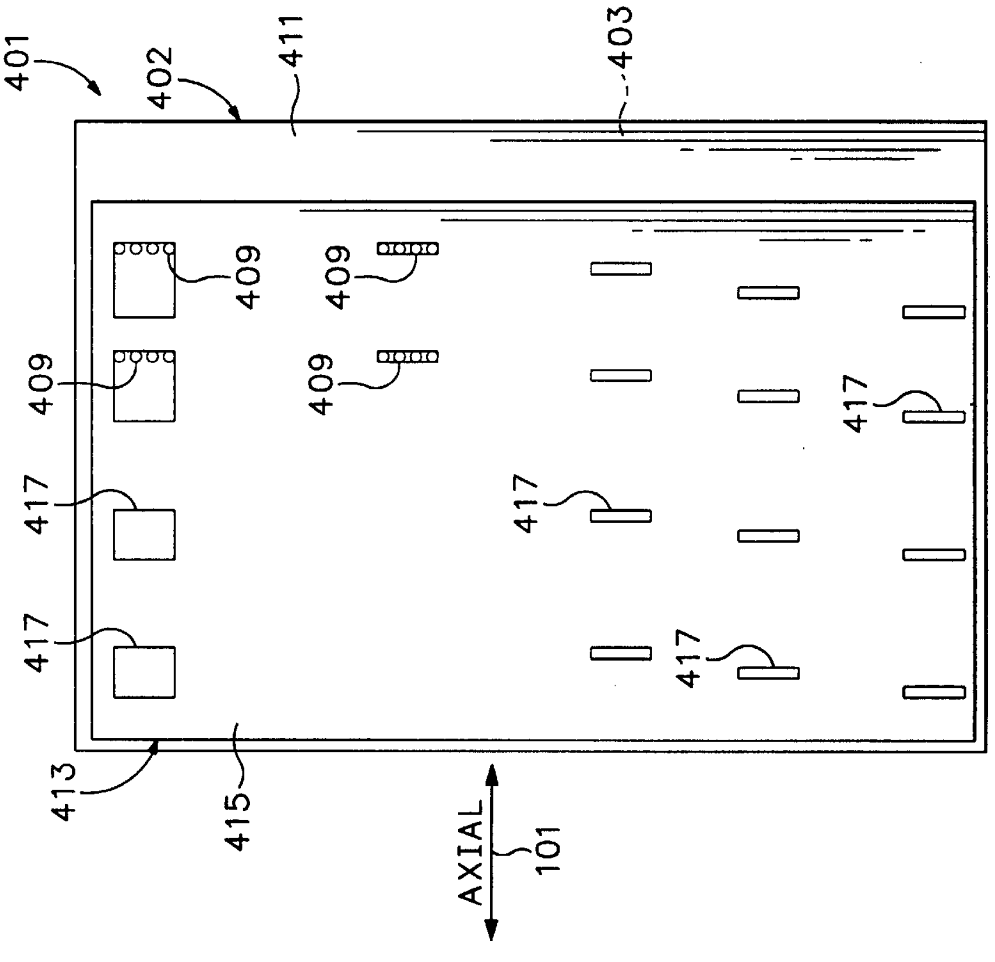
Figure 1D:
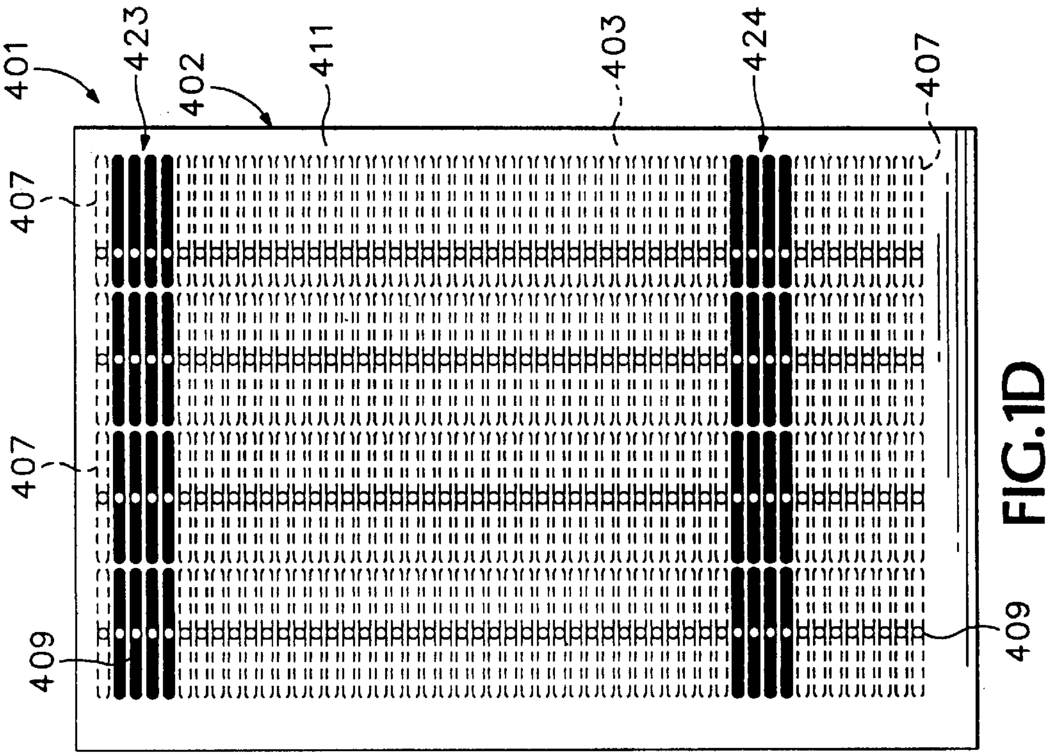
Figure 4:
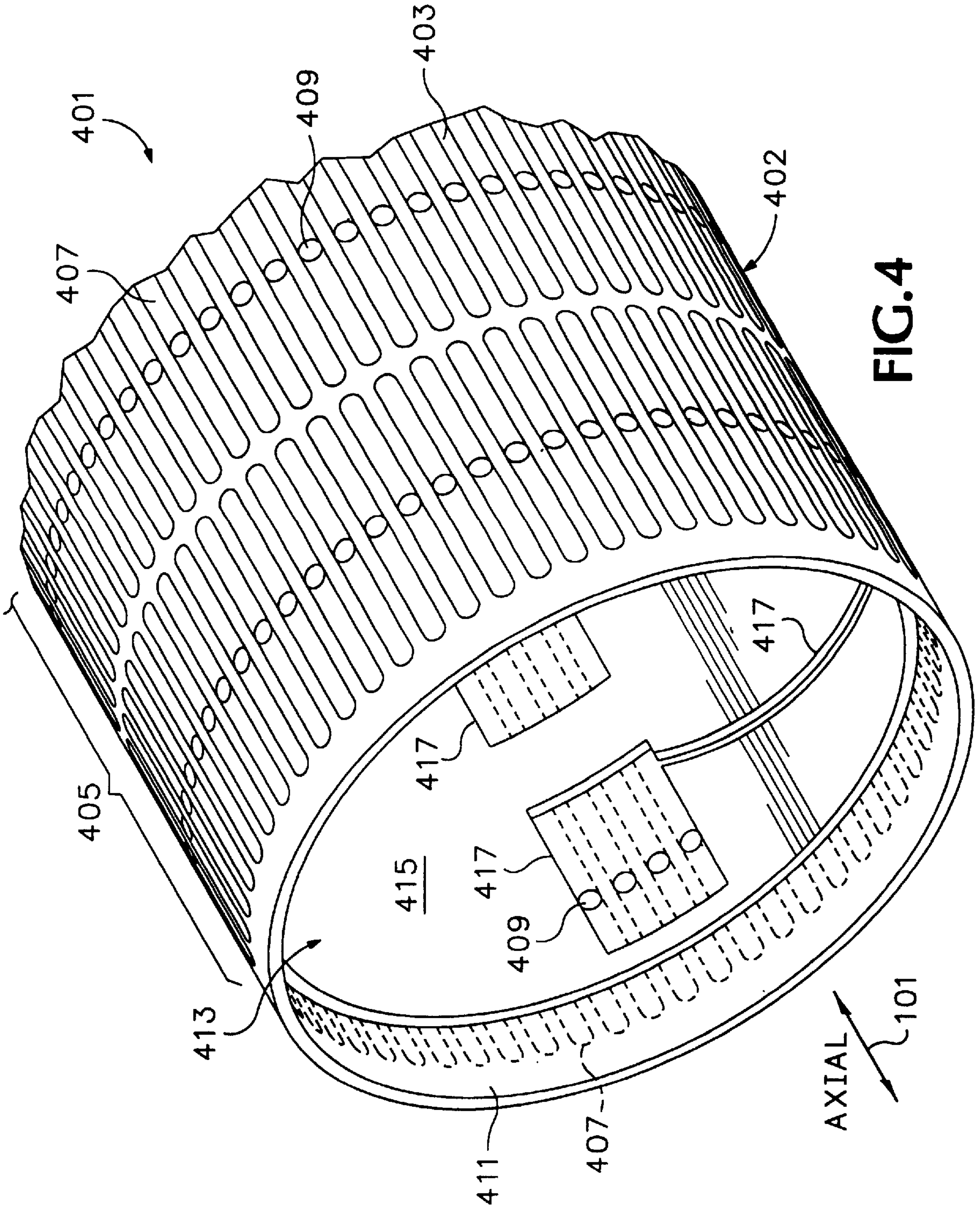
FIG. 4 is a vacuum drum platen in accordance with the present invention as demonstrated in FIGS. 1A through 3B.

FIG. 1A shows a vacuum holddown 401 in accordance with the present invention. It is intended that the present invention be implemented in any form of holddown that is constructed to fit the particular use. For example, FIG. 4 shows a cylindrical holddown platen 402 embodiment of the present as would be useful in a vacuum drum printer. FIG. 4 shows that the drum platen 402 has an outer surface 403 having a substantially symmetric pattern 405 of vacuum channels 407. Each vacuum channel 407 has at least one vacuum port 409 located at a predetermined position, such as at the midpoint, of the channel and extending through to the inner surface 411 of the platen. A sliding valve mechanism 413, such as a plate or a sleeve depending on the holddown surface configuration needed, is contained within the cylindrical vacuum drum platen 402. The sliding valve mechanism 413 has an inner surface 415 and a plurality of apertures 417 arrayed in a predetermined pattern as described in more detail hereinafter.

Note that other curvilinear shapes may be implemented. For convenience of explanation, the present invention will be described with respect to the planar embodiments of FIGS. 1A–3B; no limitation on the scope of the invention is intended by the inventors in using this exemplary embodiment nor should any such limitation be implied therefrom.

Referring also to FIG. 1B, the illustrated holddown 401 can be visualized as a planar holddown or as an unrolled print media cylindrical vacuum platen holddown 401 of FIG. 4—also referred to in the art as a "vacuum drum"—where the height of the rectangle is the circumference of the cylinder, the width of the rectangle the axial width of the cylinder. For convenience of explanation, the latter will be used as an exemplary embodiment; this visualization thus represents the view of the concentric cylinders of FIG. 4 from the inside of the holddown 401. The outer surface 403 of the drum platen 402 would be oriented in the plane of the page, so the surface channels 407 are shown in phantom line. The holddown 401 includes a sliding valve mechanism 413, also referred to hereinafter for convenience as the "sliding sleeve 413."

The sliding sleeve 413 is in an internal, sliding, face-to-face, substantially fluid tight, contact with the platen 402. A specific pattern of apertures 417 is provided through the sliding sleeve 413. The pattern is designed such that when the sleeve is moved axially (see labeled arrow 101) relative to the drum platen 402, regions of the sleeve outer surface 419 or apertures 417 respectively close or expose vacuum ports 409 in predetermined, design-specific patterns. Therefore, as vacuum force is drawn across the inner surface of the sliding valve plate sleeve 413 in a known manner, e.g., with an exhaust fan (not shown), exposed vacuum ports 409 transmit the vacuum force into their associated channels 407.

With the patterns of apertures 417 and the ported channels 407 and the sliding valve plate sleeve 413 positioned with respect to the drum platen 402 as shown in FIG. 1A, a vacuum distribution represented by the shaded channels 421 is created as shown in FIG. 1B (sliding valve plate/sleeve 413 positioned as in FIG. 1A removed for purpose of demonstration).

To continue the drum printer platen analogy, if the dimensions of the outer surface are designed to generally handle A-size media (up to 8.5×14 inch, legal), the position of FIGS. 1A and 1B would be appropriate to distributing the vacuum to an outer surface 403 region for a post card or an index card size sheet of paper, e.g., 3×5-inches or perhaps a 4×6-inch photograph.

Figure 1C:
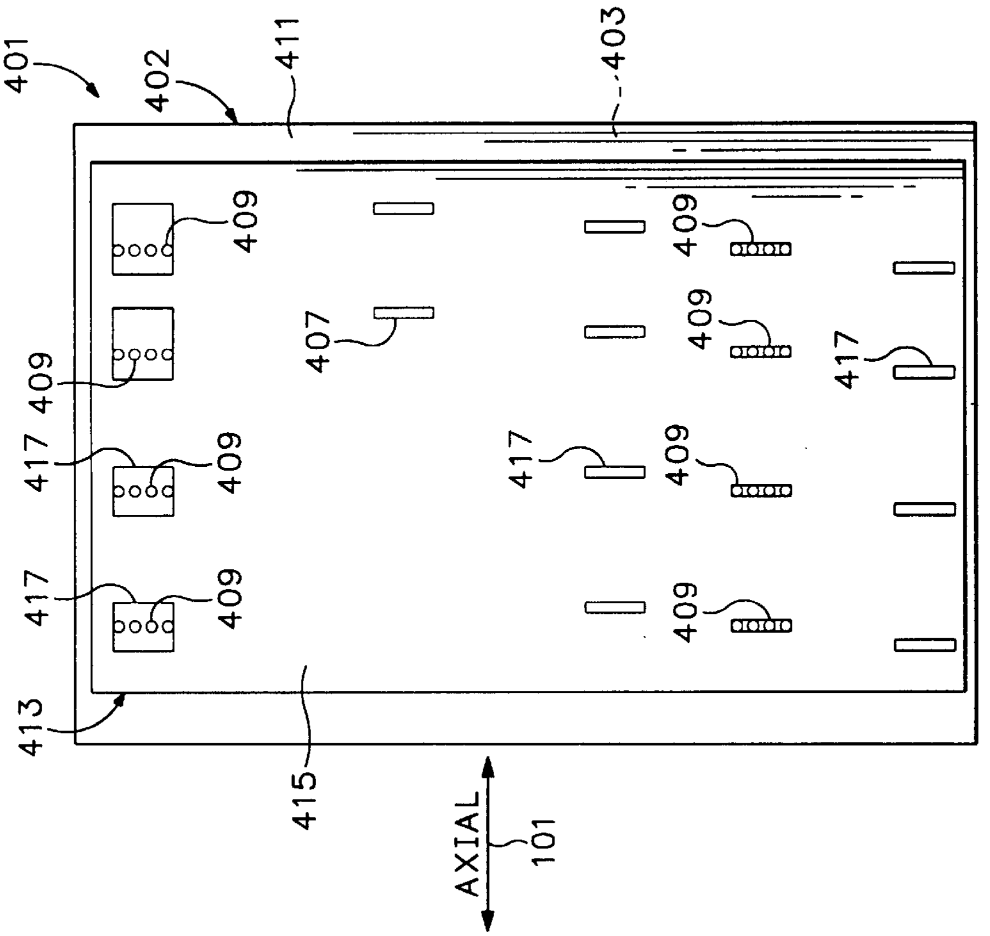

FIG. 1C illustrates the repositioned sleeve 413, shifted axially 101 to the right from FIG. 1A. In this relative position of the sleeve 413 with respect to the drum platen 402, additional vacuum ports 409 have been fluidically coupled to the vacuum across the inner surface 415 of the sleeve, creating a different vacuum distribution shown in FIG. 1D. This distribution would be appropriate to distributing the vacuum to an outer surface 403 region to capturing and temporarily securing the print media leading edge at surface region 423 and trailing edge at surface region 424 for or a letter size (8.5×11 inch) sheet of paper. Further shifting of the sleeve as shown in FIGS. 1A and 1C axially 101 to the right would similarly shift the vacuum trailing edge distribution surface region 424 to a legal size sheet of paper.

Any suitable mechanism for shifting the sliding sleeve 413 from a simple, low cost, end-user controlled manual switch to a fully automated system capable of recognizing the next size of media to be captured based upon the print data set can be employed with the present invention. Such an automated system can be employed to dynamically change the vacuum distribution in real-time holddown operational conditions when needed.

Figure 2B:
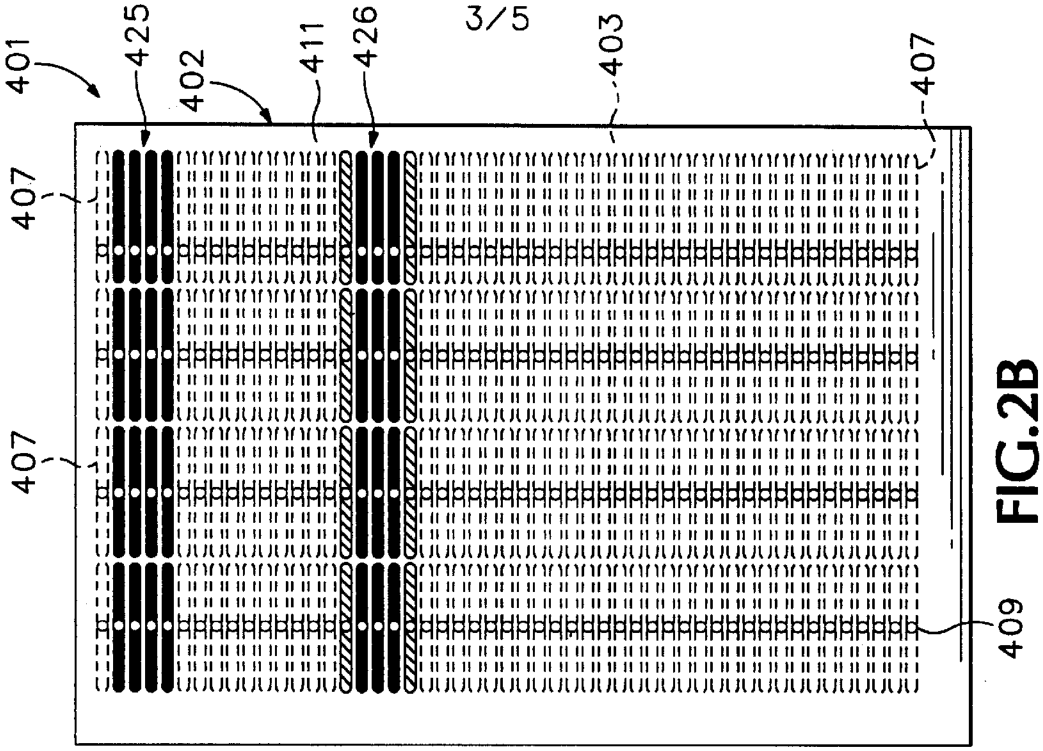
FIGS. 2A through 2B demonstrate a second embodiment of the present invention as shown in FIGS. 1A through 1D.
Figure 2A:
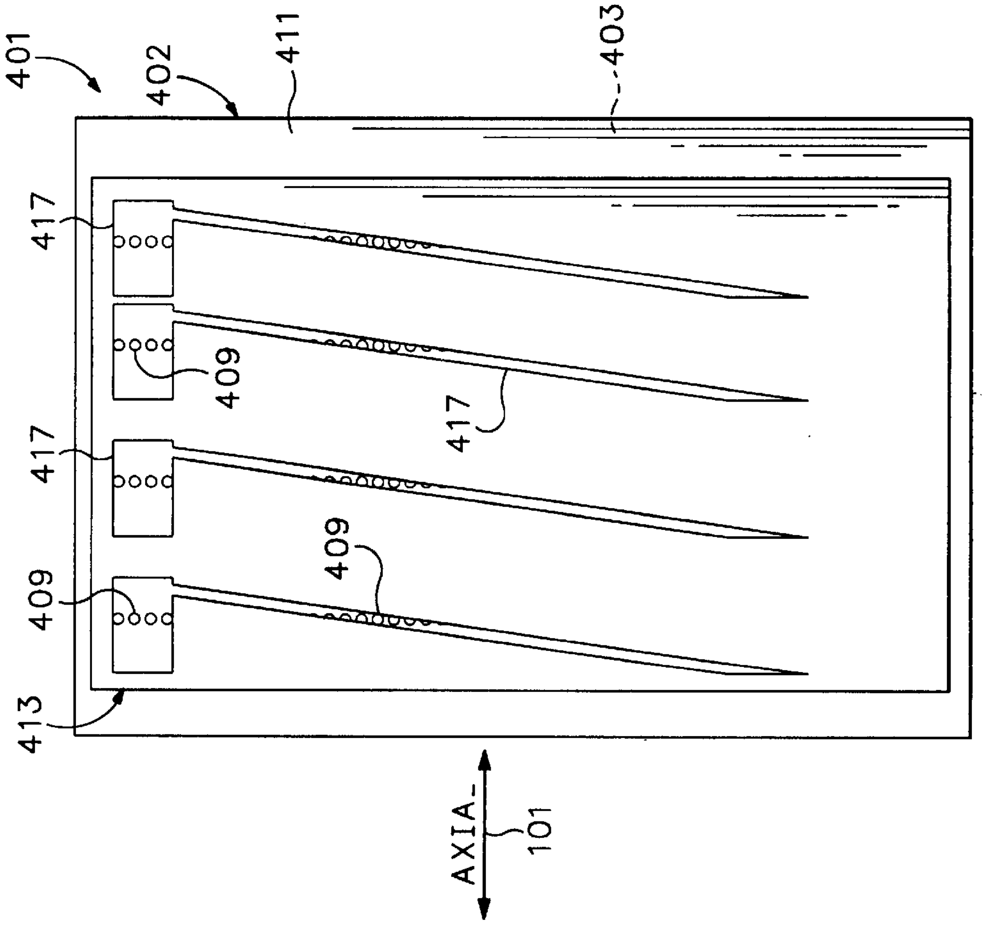

An alternative embodiment, suited for producing vacuum patterns for any length sheet up to the length of the outer surface 403 having vacuum channels 407 therein by controlling the axial position of the sleeve 413 is illustrated in FIGS. 2A and 2B. This embodiment's sliding valve sleeve 413 apertures 417 configuration is also shown in FIG. 4. The sliding valve sleeve 413 axial displacement is shown in FIG. 2A as being part way through its full range of motion and the distribution pattern created is illustrated in FIG. 2B. Note that some vacuum ports 409 are partially covered which may result in a lower vacuum force, or vacuum depletion zones, for associated platen surface channels 407; this is depicted by a lighter shading of those channels. As the sliding valve sleeve 413 has trailing edge apertures 417 connected into a diagonal band across the outer surface 403, when the sleeve 413 slides within the drum platen 402 axially from left to right the vacuum influenced region 425 of the platen for a leading edge of the sheet remains fully under the vacuum influence while the vacuum influenced region 426 of the platen for a trailing edge of a sheet moves from top to bottom (or around the circumference toward downstream regions of a sheet).

Figure 3B:
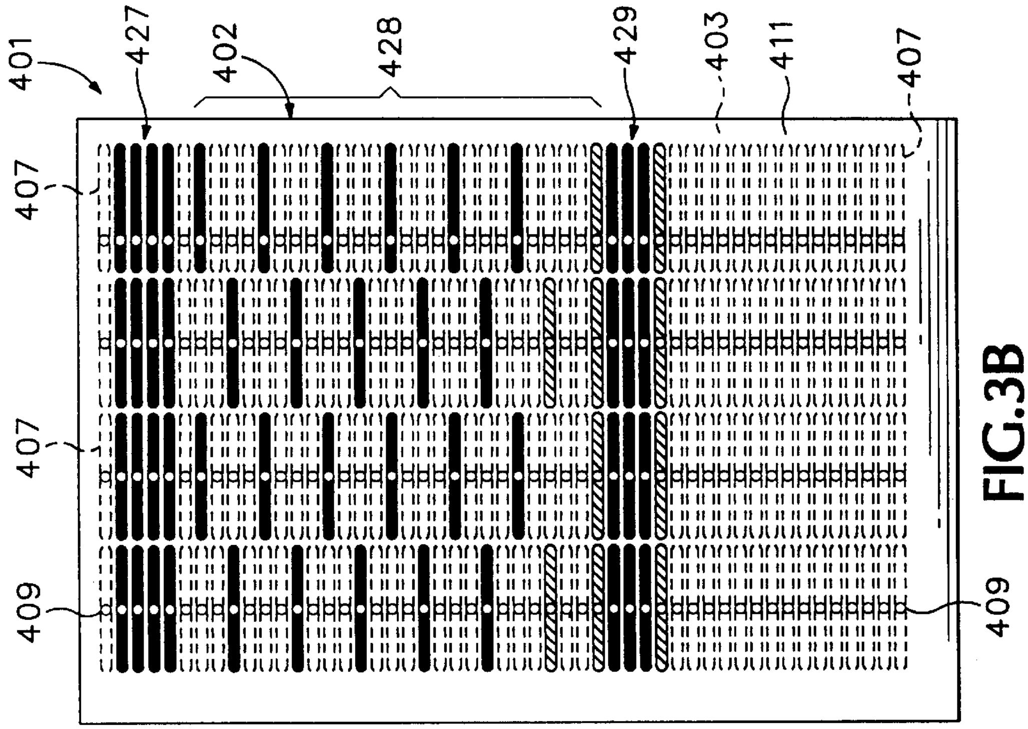
FIGS. 3A and 3B demonstrate a third embodiment of the present invention as shown in FIGS. 1A through 2B.
Figure 3A:
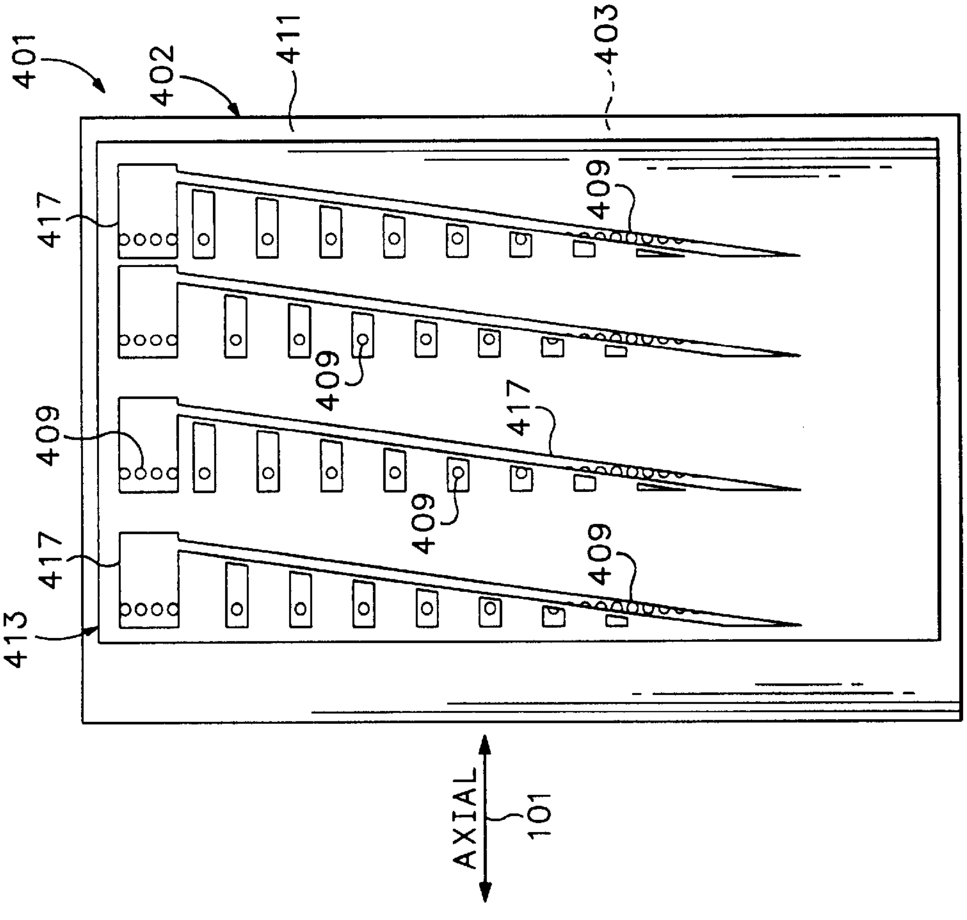

Another alternative embodiment is illustrated by FIGS. 3A and 3B. Since it is important to maintain flatness of the sheet during printing to provide uniform clearance to the writing instrument, more apertures 417 can be added to the sliding valve sleeve 413 to produce whatever level of vacuum force is desired again at a sheet leading edge region 427, a sheet trailing edge region 429, and a vacuum depletion region 428 therebetween.

It should be noted that in a drum printer embodiment the sleeves 413 may be interchangeable, giving the end-user flexibility of operation. For example, the sliding valve embodiment of FIG. 1A, having specifically targeted vacuum zones related to predetermined, commercially available, media sizes, might be swapped out for the embodiment of FIG. 2A or 3A when using special media.

Another feature of the present invention such as shown in the embodiments of FIGS. 2A–3B, particularly advantageous for a drum printer using hard-to-hold media, is the opportunity to begin loading media with all of the vacuum concentrated in a single band when the paper leading edge meets the platen. By dynamically coordinating the rotation of the drum platen with the paper feed, sleeve movement at a rate which would allow the second band of vacuum 426, to appear and effectively remain at the sheet loading point until the trailing edge of the media is captured. At that time the sleeve stops translating and the second band stays with the trailing edge during printing operations. This has a positive effect on vacuum efficiency, since waste flow through exposed holes is kept to a minimum. Higher concentrations of vacuum stay with the leading and trailing edges of the sheet where higher holddown force is needed.

Thus, the combination of platen 402 with the sliding valve plate sleeve 413 provides discrete sleeve positions to produce discrete vacuum patterns at the outer surface 403 of the holddown 401. It will be recognized by a person skilled in the art that the vacuum distribution features of a holddown in accordance with the present invention—width adjust, length, dynamic length adjust, depletion zone creation, and the like as might be useful in a particular implementation—can be combined as desired through creative shapes and orientation of valve apertures 417 for any given platen surface 403 structure. Thus, ideal flexible sheet material handling ability can be tailored to the need at hand.

As can now be recognized, the sliding sleeve 413 need not be a unitary part. Two or more sleeves residing side-by-side in the axial direction would allow keeping some channels, or columns of channels, closed for use of a narrow print medium. This avoids larger vacuum losses through exposed holes.

Moreover, a plurality of layered or concentric sliding sleeves 413 having controllable relative positioning allows a greater number of open/closed aperture combinations. This, again, is particularly useful for narrow media which would leave relatively extensive exposure of open vacuum ports and lead to a large vacuum loss.

Still further, the relative motion between the sleeve and platen could alternatively or combinatorially be in the rotational direction. A benefit of this approach is that it can mobilize the zone intended for the leading/trailing edge vacuum capture. In other words, the leading edge vacuum zone can be moved to a position on the drum where the next sheet will be presented, saving time which might be consumed if the sheet has to wait for a fixed leading edge vacuum capture zone to arrive.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. Particularly, it will be recognized by those skilled in the art that a wide variety of combinations of outer surface channels 407 with associated vacuum ports 409 can be designed to fit the needs of a specific design goal for the hold down 401 specific use; thus, no limitation on the scope of the invention is intended by the inventors in using these exemplary embodiments nor should any such limitation be implied therefrom. Similarly, any process steps described might be interchangeable with other steps in order to achieve the same result. The embodiments were chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean “one and only one” unless explicitly so stated, but rather means “one or more.” Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase: “means for . . . ”

What is claimed is:

1. A vacuum drum printer vacuum drum device comprising:

a drum having a plurality of vacuum channels in a first predetermined array across a drum outer surface, each of the vacuum channels having a vacuum port fluidically coupling an associated vacuum channel to a drum inner surface; and mounted within the drum, at least one sleeve having a sleeve outer surface in sliding face-to-face contact with the drum inner surface and having apertures therethrough in a second predetermined array such that discrete sleeve positions produce discrete vacuum patterns at the outer surface of the drum.

2. A vacuum holddown apparatus, having a vacuum source, comprising:

at least two sheets of material, said sheets separating a substrate held by vacuum from the vacuum source, wherein each of the sheets is provided with a plurality of vacuum ports and each sheet has a different pattern of the vacuum ports; and said sheets are mounted in sliding contact engagement such that shifting said engagement varies the pattern of vacuum application through the pair.

3. The apparatus as set forth in claim 2, comprising:

said sheets include a plurality of concentric, sliding sleeves having controllable relative positioning.

4. The apparatus as set forth in claim 2, comprising:

one of said sheets having a surface for exerting a vacuum force on said substrate through the respective vacuum ports thereof, wherein sliding said at least two sheets relative to each other causes re-distribution of the vacuum force at said surface in accordance with the immediate alignment of the at least two sheets.

5. The apparatus as set forth in claim 4, comprising:

re-alignment of the sheets provides vacuum distribution width adjustment across the surface.

6. The apparatus as set forth in claim 4, comprising:

re-alignment of the sheets provides vacuum distribution length adjustment across the surface.

7. The apparatus as set forth in claim 4, comprising:

re-aligning the sheets provides vacuum distribution dynamic length adjustment across the surface.

8. The apparatus as set forth in claim 4, comprising:

re-alignment of the sheets provides predetermined vacuum distribution depletion zones across the surface.

9. The apparatus as set forth in claim 4, comprising:

re-alignment of the sheets provides substantially simultaneous, dynamic, vacuum distribution width adjustment and vacuum distribution length adjustment across the surface.

10. A method for distributing a vacuum holddown vacuum force to a substrate holding surface having a plurality of vacuum transmitting first apertures therethrough in a first predetermined pattern, the method comprising:

adjacently to said surface, mounting a valve for redistributing the vacuum force between predetermined sets of channels wherein said valve has a complementary shape and size with respect to said surface, said valve means having vacuum transmitting second apertures therethrough arrayed in a second predetermined pattern; and selectively moving the valve to align selected ones of said second apertures to selected ones of said first apertures in accordance with producing a predetermined vacuum force distribution at said first surface.

11. The method as set forth in claim 10, the method further comprising:

varying the predetermined pattern of second apertures to accommodate a variety widths, lengths and thicknesses of the substrate to be held.

12. The method as set forth in claim 10, the method further comprising:

establishing predetermined, variable, vacuum distributions associated with predetermined flexible sheet material parameters for a given holding surface configuration by realigning the first predetermined pattern and the second predetermined pattern in combination.

13. The method as set forth in claim 12, the method further comprising:

capturing the flexible sheet material on the outer surface by aligning the first predetermined pattern and the second predetermined pattern to a first position wherein the vacuum force is distributed only to channels substantially adjacent a leading edge of the flexible sheet material, and dynamically realigning the first predetermined pattern and the second predetermined pattern by sliding the valve means correspondingly in synchronization with the receipt of downstream regions of the leading edge of the flexible sheet material.

14. A hard copy apparatus, having a vacuum source producing a predetermined vacuum force, the apparatus comprising:

a platen having a holddown surface and a plurality of vacuum transmitting first apertures therethrough channels in a first predetermined array, each of the first apertures fluidically coupling the vacuum force to the surface; and mounted in sliding abutment and separating the platen from the vacuum source, at least one vacuum distribution altering device having vacuum transmitting second apertures therethrough in a second predetermined array such that discrete positions of the vacuum distribution altering device with respect to the platen produce discrete vacuum force patterns at the surface.

15. The apparatus set forth in claim 14, further comprising:

said sliding abutment establishes predetermined, variable, vacuum distributions associated with predetermined print media parameters for a given said surface configuration by realigning the first predetermined pattern and the second predetermined pattern in combination.

16. The apparatus as set forth in claim 14, the apparatus further comprising:

capturing sheet media on the surface by aligning the first predetermined pattern and the second predetermined pattern to a first position wherein the vacuum force is distributed only to channels substantially adjacent a leading edge of the sheet media, and dynamically realigning the first predetermined pattern and the second predetermined pattern by sliding the valving device correspondingly in synchronization with the receipt of downstream regions of the leading edge of the sheet media.

* * * * *